United States Patent [19] … [11] 4,227,257
Sato … [45] Oct. 7, 1980

[54] POWER SUPPLY CIRCUIT FOR AN ELECTRONIC TUNING TYPE RECEIVER WITH A MEMORY ELEMENT

[75] Inventor: Reisuke Sato, Kawagoe, Japan

[73] Assignee: Pioneer Electronic Corporation, Tokyo, Japan

[21] Appl. No.: 913,926

[22] Filed: Jun. 8, 1978

[30] Foreign Application Priority Data

Jun. 10, 1977 [JP] Japan ................................ 52-75744

[51] Int. Cl.³ .......................................... H04B 1/06
[52] U.S. Cl. .................................... 455/343; 307/64; 328/262; 340/870.39; 365/229
[58] Field of Search ............... 325/492, 185, 186, 464; 307/44, 46, 48, 60, 64, 66; 328/258, 262, 264, 267; 340/210, 212, 693; 365/228, 229

[56] References Cited

U.S. PATENT DOCUMENTS

| 3,493,685 | 2/1970 | Attwood | 325/492 |
| 3,750,123 | 7/1973 | Caillouet, Jr. | 307/64 |
| 3,753,001 | 8/1973 | Hiroshima et al. | 307/64 |
| 3,859,638 | 1/1975 | Hume, Jr. | 365/229 |
| 3,980,935 | 9/1976 | Worst | 365/229 |
| 4,122,359 | 10/1978 | Breikss | 365/229 |

Primary Examiner—Robert L. Richardson
Assistant Examiner—Tommy P. Chin
Attorney, Agent, or Firm—Sughrue, Rothwell, Mion, Zinn and Macpeak

[57] ABSTRACT

Power is provided for maintaining the contents of the memory in a digital receiver by providing a second output terminal for driving the memory element when either the power switch is turned off or the main power supply is interrupted.

4 Claims, 1 Drawing Figure

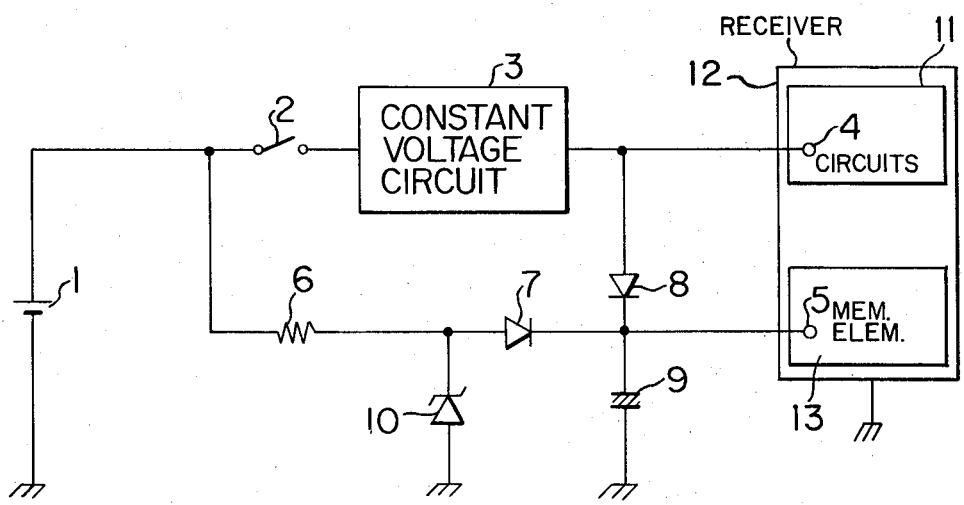

POWER SUPPLY CIRCUIT FOR AN ELECTRONIC TUNING TYPE RECEIVER WITH A MEMORY ELEMENT

BACKGROUND OF THE INVENTION

This invention relates to power supply circuits, and more particularly to a power supply circuit which reserves a power supply for a memory element in an electronic tuning type receiver.

Recently, a variety of receivers in electronic tuning systems have been proposed due to remarkably rapid progress in electronics. In the electronic tuning system, a receiving frequency is controlled by voltage-controlling a variable capacitance diode (varicap) provided in a tuning section. There have been proposed a variety of systems for controlling the tuning voltage. A typical one of the systems is a digital system in which, for purposes of stability, a digital value is employed for indication and the digital value is subjected to digital-to-analog conversion to be emplyed as a tuning control voltage. In an electronic tuning type receiver thus organized, a preset station selecting circuit is provided in which digital values manually set up, are stored in a read-write memory separately according to bands and channels, and the values thus stored are read out for station selection. Generally, a memory element is of the volatile type or non-volatile type.

In the above-described electronic tuning type receiver with a suitable volatile type memory element, it is necessary to provide a power supply for the memory element for allowing the latter to maintain its memory contents at all times even when the power switch is turned off. This requirement can be readily met if a commercial power supply is utilized for the receiver; however, it is difficult to satisfy the requirement in the case where the receiver is used as a receiver on a vehicle as in the case of a car stereophonic receiver. In other words, if the engine switch is turned off, all of the power supplies are turned off. Therefore, the memory element cannot maintain its memory operation and, accordingly, the preset station selection cannot be conducted. Furthermore, when the engine of an automobile is started, the starter consumes a great amount of electric power, as a result of which the supply voltage is decreased and, therefore, it is not possible for the memory element to carry out its memory operation.

SUMMARY OF THE INVENTION

Accordingly, an object of this invention is to provide a power supply circuit for an electronic tuning type receiver with a memory element, which is suitable for use on a vehicle.

Briefly, the present invention accomplishes this by providing a second output terminal connected directly to the main power supply and for powering the memory element only, a capacitor for providing power to the second output during interruptions of the main power source, a Zener diode for regulating the voltage of the second output when the power switch is turned off and a pair of diodes for allowing the second terminal to be driven by the voltage regulator output during normal operation and preventing the second output terminal from driving the remaining circuitry when the power switch is turned off.

BRIEF DESCRIPTION OF THE DRAWING

In the accompanying drawing, the single FIGURE is a circuit diagram showing one example of the power supply circuit according to the present invention.

DETAILED DESCRIPTION OF THE INVENTION

In the accompanying drawing, the single FIGURE shows one example according to the present invention of a power supply circuit for an electronic tuning type receiver which has a memory element. In the FIGURE, reference numeral 1 designates a battery to be installed on a vehicle; reference numeral 2, a power switch; reference numeral 3, a constant voltage circuit which receives the output of the battery 1 through the power switch 2, the output of the constant voltage circuit 3 being applied to a first power supply terminal 4 through which current is applied to the circuits 11 of the electronic tuning type receiver 12 except for the memory element 13 thereof; and reference numeral 5, a second power supply terminal through which power is supplied to the memory element which is low in power consumption. Furthermore, reference numeral 6 designates a resistor one terminal of which is connected to the positive terminal of the battery 1; reference numeral 7, a diode connected in the forward direction between the other terminal of the resistor 6 and the second power supply terminal 5; reference numeral 8, a diode connected in the forward direction between the output terminal of the constant voltage circuit 3 and the second power supply terminal 5; reference numeral 9, a capacitor connected between the second power supply terminal 5 and ground; and reference numeral 10, a Zener diode connected between the anode of the diode 7 and ground.

With the power supply circuit thus organized, when the power switch 2 is closed, the output of the battery 1 is supplied through the power switch 2 to the constant voltage circuit 3, where variations of the supply voltage due to other loads are removed and the output of the battery is converted into a constant voltage. The constant voltage is supplied through the first power supply terminal 4 to the receiver circuits except for the memory element. The output of the constant voltage circuit 3 is charged into the capacitor 9 through the diode 8 and is supplied to the memory element 13, which is low in power consumption, through the second power supply terminal 5. Thus, the electronic tuning type receiver with the memory element can perform its normal operation.

When the power switch 2 is turned off, no output is provided by the constant voltage circuit 3. Accordingly, no current is supplied through the terminal 4 to the circuits other than the memory element and, therefore, the signal receiving operation of the receiver is suspended. On the other hand, when the power switch 2 is turned off, the output of the battery 1 is applied through the resistor 6 and the diode 7 to the second power supply terminal 5. Therefore, the output of the battery is applied to the memory element, and the contents stored in the memory element are maintained. In this operation, the variation in output of the battery 1 is absorbed by the Zener diode 10 so as to provide a constant voltage, while the leaking of current into the first power supply terminal 4 is prevented by the diode 8.

It is preferable that a stabilized voltage is supplied through the constant voltage circuit 3 during the normal operation. Therefore, the operating voltage of the Zener diode 10 is lower than the output voltage of the constant voltage circuit, so that the battery output variation does not affect the capacitor 9 and so that even when the power switch 2 is turned off, the Zener voltage is maintained across the capacitor 9.

When the engine of the vehicle is started, the starter (not shown) thereof will consume great electric power. When the cable of the battery is removed from its terminal for instance, the output of the battery is interrupted for a relatively short time. In these cases, the charges in the capacitor 9 are supplied only to the memory element through the second power supply terminal 5 and, therefore, the contents stored therein are maintained. In this case, the output of the capacitor 9 leaking into the other circuits is prevented by diodes 7 and 8. Therefore, the output of the capacitor 9 is supplied to the low power consumtion type memory element only, so that if the capacitance of the capacitor 9 is set to a relatively high value, it is possible to energize the memory element for several days, even several tens of days, when the output of the battery 1 is interrupted for some reason. Thus, it is possible to stably use the electronic tuning type receiver as a receiver on a vehicle.

As is apparent from the above description, the power supply circuit for the electronic tuning type receiver with the memory element according to this invention is provided with a first power supply terminal which is deenergized by opening the power switch, and a second power supply terminal which, under normal conditions, supplies the output of the power switch through the leak current preventing diode 8, which directly supplies the output of the battery through the leak current preventing diode 7 when the power switch is turned off, and which outputs the charge in the capacitor when the output of the battery is interrupted. The output of the first power supply terminal is employed as a power supply for all the circuits except for the memory element, while the output of the second power supply terminal is employed as a power supply for the memory element only, which is low in power consumtion. Therefore, even if the power switch is turned off, or the output of the battery is decreased or temporarily interrupted, the contents stored in the memory element can be positively maintained. Thus, the power supply circuit according to the invention is most suitable as a power supply to be installed on a vehicle for an electronic tuning type receiver having a memory element.

What is claimed is:

1. A power supply circuit for an electronic tuning receiver having circuits including a memory element, said power supply being of the type in which power is supplied from a battery through a power switch and a constant voltage circuit to a first power supply terminal, wherein the improvement comprises:
    a second power supply terminal;
    first diode means for providing the power at said first power supply terminal to said second power supply terminal and for preventing the flow of power from said second to said first power supply terminals;
    second diode means for providing power directly from said battery to said second power supply terminal and for preventing the flow of power in the reverse direction; and
    a capacitor connected between said second power supply terminal and ground, said first power supply terminal supplying power to said circuits of said receiver except said memory element, and said second power supply terminal supplying power only to said memory element, so that: when said power switch is on, power is supplied from said first terminal to said memory element through said first diode means; when said power switch is off, power is supplied to said memory element through said second diode means; and when said battery is disconnected, power is supplied to said memory element from said capacitor.

2. A power supply circuit according to claim 1, further comprising a Zener diode connected between ground and the side of said second diode means away from said second power supply terminal.

3. A power supply circuit according to claim 2, wherein the operating voltage of said Zener diode is less than the output voltage of said constant voltage circuit.

4. A power supply circuit for an electronic tuning receiver having circuits including a memory element, said power supply being of the type in which power is supplied from a battery through a power switch and a constant voltage circuit to a first power supply terminal, wherein the improvement comprises:
    a second power supply terminal;
    first diode means for providing the power at said first power supply terminal to said second power supply terminal and for preventing the flow of power from said second to said first power supply terminals;
    second diode means for providing power directly from said battery to said second power supply terminal and for preventing the flow of power in the reverse direction;
    a capacitor connected between said second power supply terminal and ground, said first power supply terminal supplying power to said circuits of said receiver except said memory element, and said second power supply terminal supplying power only to said memory element, so that: when said power switch is on, power is supplied from said first terminal to said memory element through said first diode means; when said power switch is off, power is supplied to said memory element through said second diode means; and when said battery is disconnected, power is supplied to said memory element from said capacitor; and
    said second diode means is coupled between said second terminal and the battery side of said power switch.

* * * * *